US007172708B2

(12) United States Patent
Kinoshita et al.

(10) Patent No.: US 7,172,708 B2
(45) Date of Patent: *Feb. 6, 2007

(54) PROCESS FOR THE FABRICATION OF THIN-FILM DEVICE AND THIN-FILM DEVICE

(75) Inventors: Tomoatsu Kinoshita, Kanagawa (JP); Akihiko Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 316 days.

This patent is subject to a terminal disclaimer.

(21) Appl. No.: 10/782,658

(22) Filed: Feb. 19, 2004

(65) Prior Publication Data
US 2004/0232104 A1    Nov. 25, 2004

(30) Foreign Application Priority Data
Feb. 25, 2003 (JP) ............................. P2003-046774

(51) Int. Cl.
*B44C 1/22* (2006.01)
(52) U.S. Cl. ....................... 216/95; 216/103; 216/104; 438/747
(58) Field of Classification Search ................ 216/96, 216/103, 104, 95; 438/747
See application file for complete search history.

(56) References Cited
U.S. PATENT DOCUMENTS

| 5,391,257 | A | 2/1995 | Sullivan et al. |
| 5,472,914 | A | 12/1995 | Martin et al. |
| 5,680,190 | A * | 10/1997 | Michibayashi et al. ..... 349/140 |
| 6,682,990 | B1 * | 1/2004 | Iwane et al. ................. 438/458 |
| 6,916,681 | B2 * | 7/2005 | Asano et al. .................. 438/99 |

FOREIGN PATENT DOCUMENTS

| JP | 2001-189460 | 7/2001 |
| JP | 2001-353700 | 12/2001 |
| JP | 2002-184959 | 6/2002 |

OTHER PUBLICATIONS

Australian Patent Office Search Report dated Jan. 23, 2006.

* cited by examiner

Primary Examiner—Duy-Vu N. Deo
Assistant Examiner—Binh X. Tran
(74) Attorney, Agent, or Firm—Sonnenschein Nath & Rosenthal LLP

(57) ABSTRACT

A thin-film device is fabricated by forming a protective layer and a thin-film device layer one by one on a first substrate and bonding a second substrate on the thin-film device layer via a first adhesive layer or a coating layer and first adhesive layer, removing the first substrate at least in a part thereof by etching with a chemical solution, bonding the protective layer, which covers the thin-film device layer on a side of the first substrate, to a third substrate via a second adhesive layer, and removing the second substrate. The protective layer is formed of at least two layers having resistance to the chemical solution used upon removal of the first substrate.

20 Claims, 11 Drawing Sheets

PROCESS FOR THE FABRICATION OF THIN-FILM DEVICE AND THIN-FILM DEVICE

RELATED APPLICATION DATA

The present application claims priority to Japanese Application(s) No(s). P2003-046774 filed Feb. 25, 2003, which application(s) is/are incorporated herein by reference to the extent permitted by law.

BACKGROUND OF THE INVENTION

This invention relates to a fabrication process of a thin-film device and also to a thin-film device, and specifically to a process for fabricating a thin-film device, which is useful in a liquid crystal display, organic electroluminescence display or the like, by forming the thin-film device on an original substrate having high heat resistance and then transferring it onto an application substrate and also to the thin-film device obtained by the fabrication process.

In recent years, thin-film devices are receiving a demand for thickness reduction, weight reduction and solidness under the influence of a move toward smaller equipment in which they are used. A limitation is, however, imposed on substrates for use in fabrication because thin-film devices are fabricated in a high-temperature vacuum environment. Employed, for example, in a liquid crystal display which makes use of thin-film transistors are silica substrates capable of withstanding temperatures up to 1,000° C. or glass substrates capable of withstanding temperatures up to 500° C. Thickness reductions of these substrates have been studied but, insofar as silica substrates or glass substrates are used, the substrates have to be reduced in size to cope with a reduction in rigidity so that the productivity is reduced. Further, a reduction in the thickness of a substrate immediately leads to a significant reduction in solidness, thereby developing a practical problem. As is appreciated from the foregoing, there is a difference between the performance required for an original substrate and the performance required upon actually using the thin-film device. Attempts have also been made to fabricate thin-film transistors directly on plastic substrates which permit thickness reduction, weight reduction and solidness improvement. These attempts, however, involve significant difficulties from the standpoint of the maximum withstand temperatures of the plastic substrates.

Investigations have, therefore, been made on techniques for transferring a thin-film device, which has been formed on an original substrate having a high maximum withstand temperature, onto an application substrate. For this transfer, it is necessary to separate only the thin-film device from the original substrate. Certain methods have been proposed for this purpose, including provision of a removable layer and subsequent etching of the removable layer with a chemical solution to separate a thin-film device layer and an original substrate from each other (see, for example, PCT International Application No. WO02/084739, page 9 and FIG. 2) and removal of an original substrate in its entirety by etching (see, for example, ibid., page 9 and FIG. 1D).

For the removal of an original substrate with a chemical solution subsequent to the formation of a thin-film device on the original substrate, it is necessary to form a protective layer with a thin film before the formation of the device layer such that the chemical solution is prevented from penetrating to the device layer. However, a thin-film layer formed by sputtering, vapor deposition or CVD is generally accompanied by a problem that it contains more or less pinholes and a chemical solution may penetrate to a device layer through the pinholes to damage the device layer with the chemical solution.

SUMMARY OF THE INVENTION

An object of the present invention is, therefore, to prevent penetration of a chemical solution, which is used upon removal or separation of an original substrate, to a device layer upon transferring the device layer from the original substrate onto an application substrate.

In one aspect of the present invention, there is thus provided a process for the fabrication of a thin-film device. The process includes the following steps: forming a protective layer and a thin-film device layer one by one on a first substrate, and bonding a second substrate on the thin-film device layer via at least a first adhesive layer, removing the first substrate at least in a part thereof by etching with a chemical solution, bonding the protective layer, which covers the thin-film device layer on a side of the first substrate, to a third substrate via a second adhesive layer, and removing the second substrate. The protective layer is formed of at least two layers having resistance to the chemical solution used upon removal of the first substrate.

According to the above-described process, the protective layer for protecting the device layer from the chemical solution to be employed upon removal of the first substrate is formed of at least two layers having resistance to the chemical solution. Practically speaking, the protective layer is hence formed of two or more layers. Even if the chemical solution reaches the inner protective layer (second protective layer) through pinholes formed in the protective layer (first protective layer) closer to the chemical solution, any further penetration of the chemical solution toward the device layer can be prevented by the second protective layer. The pinholes in each of the two layers having resistance to the chemical solution to be employed upon removal of the first substrate are very small and occur at random. Accordingly, the probability that the pinholes in one of the two layers and those in the other layer would be formed at the same locations is extremely low. The above-described anti-penetration measure makes use of this extremely low-probability. Let's assume, for example, that pinholes are formed in the first protective layer having resistance to the chemical solution to be used upon removal of the first substrate. Even if the chemical solution penetrates through the first protective layer, there is the second protective layer which has resistance to the chemical solution employed upon removal of the first substrate. The chemical solution is, therefore, blocked there. With the above-described at least two layers having resistance to the chemical solution to be used upon removal of the first substrate, penetration of the chemical to the device layer can be surely prevented. Accordingly, transfer-related defects can be decreased. The process of the present invention, therefore, makes it possible to fabricate thin-film devices of high quality while assuring a high production yield.

In another aspect of the present invention, there is also-provided a thin-film device formed by performing the following steps: forming a protective layer and a thin-film device layer one by one on a first substrate, and bonding a second substrate on the thin-film device layer via at least a first adhesive layer, removing the first substrate at least in a part thereof by etching with a chemical solution, bonding the protective layer, which covers the thin-film device layer on a side of the first substrate, to a third substrate via a second adhesive layer, and removing the second substrate. The protective layer is formed of at least two layers having resistance to the chemical solution used upon removal of the first substrate.

In further aspect of the present invention, there is thus provided a process for the fabrication of a thin-film device. The process includes the following steps: forming a protective layer and a thin-film device layer one by one on a first substrate, and bonding a second substrate on the thin-film device layer via at least a first adhesive layer, separating the first substrate at least in a part thereof by etching with a chemical solution, bonding the protective layer, which covers the thin-film device layer on a side of the first substrate, to a third substrate via a second adhesive layer, and separating the second substrate. The protective layer is formed of at least two layers having resistance to the chemical solution used upon separation of the first substrate.

In yet further aspect of the present invention, there is also provided a thin-film device formed by performing the following steps: forming a protective layer and a thin-film device layer one by one on a first substrate, and bonding a second substrate on the thin-film device layer via at least a first adhesive layer, separating the first substrate at least in a part thereof by etching with a chemical solution, bonding the protective layer, which covers the thin-film device layer on a side of the first substrate, to a third substrate via a second adhesive layer, and separating the second substrate. The protective layer is formed of at least two layers having resistance to the chemical solution used upon separation of the first substrate.

The thin-film device is free from the penetration of the chemical solution, because it can bring about similar effects and advantage as the above-described fabrication process. Thin-film devices according to the present invention can, therefore, be fabricated with a high production yield. Use of thin-film devices makes it possible to provide liquid crystal displays or organic EL displays of excellent quality.

DESCRIPTION OF THE PREFERRED EMBODIMENT

With reference to FIGS. 1A through 4C, a description will be made about a process according to a first embodiment of the present invention for the fabrication of a thin-film device, specifically about steps for forming a transmission active substrate on a plastic substrate by a transfer method for the fabrication of a liquid crystal display.

Figure 1A:
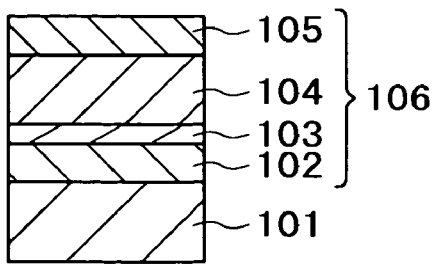
FIGS. 1A through 1E show a partial fabrication flowchart of a process according to a first embodiment of the present invention for the fabrication of a liquid crystal display.

As illustrated in FIG. 1A, a glass substrate or silica substrate of approximately 0.4 to 1.1 mm thickness is used as a first substrate 101 which will serve as an original substrate. A first anti-HF layer 102 having resistance to hydrogen fluoride and hydrofluoric acid, a first insulating layer 103, a second anti-HF layer 104 having resistance to hydrogen fluoride and hydrofluoric acid, and a second insulating layer 105 are formed one by one from the lowest layer on the first substrate 101 (for example, a glass substrate of 0.7 mm thickness) to provide a protective layer 106. The first anti-HF layer 102 is arranged by forming, for example, a molybdenum (Mo) thin film to an illustrative thickness of 500 nm. The first insulating layer 103 is provided by forming, for example, a silicon oxide ($SiO_2$) layer to an illustrative thickness of 100 nm. The second anti-HF layer 104 is arranged by forming, for example, a molybdenum (Mo) thin film to an illustrative thickness of 1,000 nm. The second insulating layer 105 is provided by forming, for example, a silicon oxide ($SiO_2$) layer to an illustrative thickness of 500 nm. The molybdenum thin films can be formed by sputtering, while the silicon oxide layers can be formed by plasma CVD (chemical vapor deposition). It is to be noted that the above-described "HF" means hydrogen fluoride or hydrofluoric acid in this specification.

TFT is then formed as a thin-film device layer by a low-temperature polysilicon bottom-gate thin-film transistor (TFT) process such-as that described, for example, in "'99 Latest Liquid Crystal Process Technology", 53–59, Press Journal Inc., Tokyo, 1998 or "Flat Panel Displays 1999", 132–139, Nikkei Business Publications, Inc., Tokyo, 1998.

Figure 2:
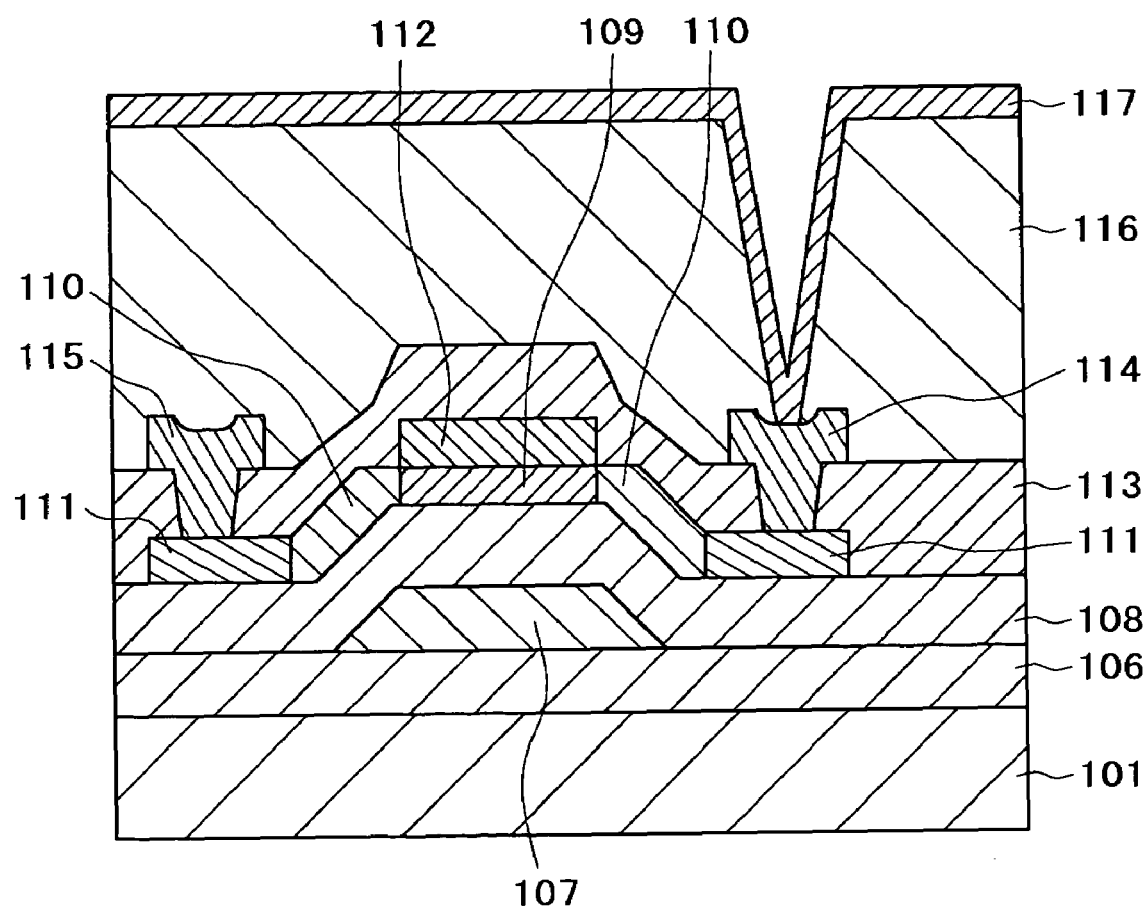
FIG. 2 is a fragmentary schematic cross-sectional view of a transmission active matrix substrate formed in the step illustrated in FIG. 1A.

As illustrated in FIG. 2, a gate electrode 107 is firstly formed on the protective layer 106, for example, with a molybdenum film the thickness of which is 100 nm, for example. This gate electrode 107 can be formed by conventional photolithography and etching techniques subsequent to the formation of the molybdenum film. By plasma CVD, for example, a gate insulation film 108 is formed with a silicon oxide ($SiO_2$) layer or with a laminate composed of a silicon oxide ($SiO_2$) layer and a silicon nitride ($SiN_x$) layer such that the gate electrode 107 is covered by the gate insulation film 108. In continuation with the gate insulation film 108, an amorphous silicon layer (thickness: 30 nm to 100 nm) is formed further. A pulsed XeCl excimer laser beam with a wavelength of 308 nm is irradiated to the amorphous silicon layer to melt and recrystallize it such that a polysilicon layer is formed as a crystalline silicon layer. Using this polysilicon layer, a polysilicon layer 109 is formed to provide a channel-forming region. Formed on each side of the polysilicon layer 109 are a polysilicon layer 110 composed of an n⁻ dope region and a polysilicon layer 111 composed of an n⁺ dope region. As appreciated from the foregoing, each active region is formed as an LDD (lightly doped drain) structure compatible with both a high on-current and a low off-current. On the polysilicon layer 109, a stopper layer 112 is formed, for example, with a $SiO_2$ layer to protect the channel upon implantation of n⁻ phosphorus ions.

By plasma CVD, a passivation film 113 is formed further with a silicon oxide ($SiO_2$) layer or with a laminate composed of a silicon oxide ($SiO_2$) layer and a silicon nitride ($SiN_x$) layer. On the passivation film 113, a source electrode 114 and drain electrode 115 are formed, for example, with aluminum such that these electrodes are connected to the individual polysilicon layers 111.

To protect the device and also to effect planarization, a planarization layer 116 is then formed, for example, with a methyl-methacrylate-based resin, for example, by the spin coating method such that the source electrode 114, the drain electrode 115 and the like are covered by the planarization layer 116. In the planarization layer 116, a contact hole is formed extending to the source electrode 111. By sputtering, for example, a transparent conductive film (for example, indium tin oxide, $In_2O_3+SnO_2$; hereinafter called "ITO") is then formed on the planarization layer 116 to provide a pixel electrode 117 such that the pixel electrode 117 is connected to the source electrode 114 via the contact hole.

By the above-described steps, a transmission active matrix substrate can be formed on the first substrate 101. A top-gate polysilicon TFT or amorphous TFT can be formed likewise although the bottom-gate polysilicon TFT was formed in the above description. A description will next be made about steps for transferring the thin-film device layer from the first substrate 101 onto a plastic substrate.

Figure 1B:
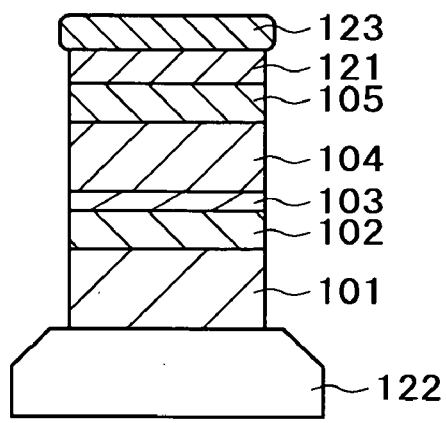

As described above with reference to FIG. 1A, an intermediate construction has been obtained by forming the first anti-HF layer 102, the first insulating layer 103, the second anti-HF layer 104, the second insulating layer 105 and a thin-film device layer 121 on the first substrate 101. Reference is now had to FIG. 1B. While heating the intermediate construction at 80° C. to 140° C. on a hot plate 122, a first adhesive layer 123 is formed by coating, for example, a hot melt adhesive to an illustrative thickness of 1 mm or so.

Figure 1C:
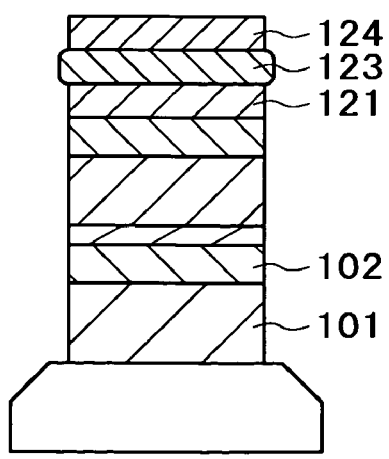

As shown in FIG. 1C, a second substrate 124 is next mounted on the first adhesive layer 123 and, while pressing the second substrate 124 toward the first substrate 101, the resulting intermediate construction is allowed to cool down to room temperature. As the second substrate 124, a molybdenum (Mo) substrate of 1 mm thickness can be used, for example. As an alternative, it is possible to coat a hot melt adhesive on the second substrate 124 and then to mount the first substrate 101, on which the layers ranging from the first anti-HF layer 102 to the thin-film device layer 121 have been formed, on the thus-coated hot melt adhesive with the thin-film device layer 121 being directed toward the second substrate 124.

Figure 1D:
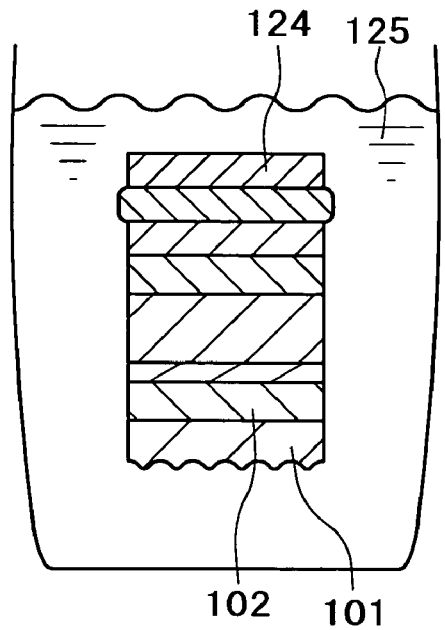

Reference is next had to FIG. 1D. An intermediate construction with the second substrate 124 bonded thereto via the first adhesive layer 123 interposed therebetween is then dipped in hydrofluoric acid (HF) 125 to perform etching of the first substrate 101. Because the molybdenum layer as the first anti-HF layer 102 is not etched with the hydrofluoric acid 125, the etching automatically stops at the first anti-HF layer 102. Illustrative of the hydrofluoric acid 105 employed here is one having a weight concentration of 50%. With such an etchant, the etching time can be set, for example, at 3.5 hours. The concentration of the hydrofluoric acid 125 and the etching time with the hydrofluoric acid 125 may be changed without any problem insofar as the glass of the first substrate 101 can be fully etched off.

Figure 1E:
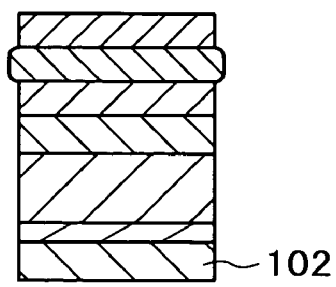

As a result of the above-described etching with the hydrofluoric acid 125, the first substrate 101 (see, for example, FIG. 1D already referred to in the above) is fully etched off so that the first anti-HF layer 102 is exposed (see FIG. 1E).

Figure 3A:
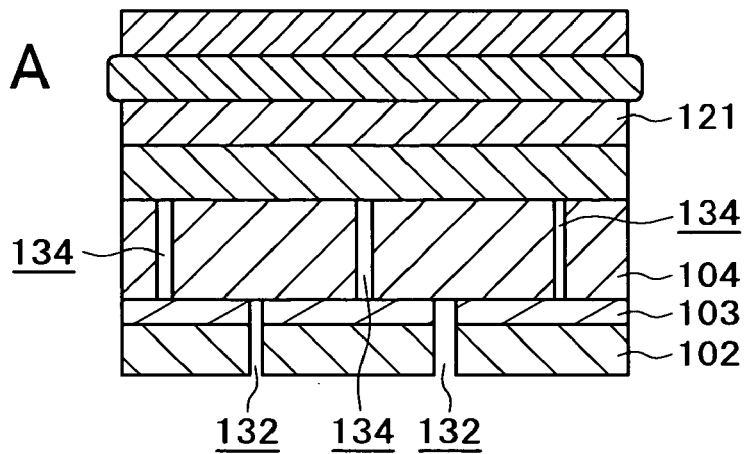
FIGS. 3A through 3D are fragmentary schematic cross-sectional views depicting penetration of hydrofluoric acid through pinholes in two protective layers in an etching step shown in FIG. 1D.

When pinholes 132 are contained in the molybdenum layer as the first anti-HF layer 102 as shown in FIG. 3A, the first insulation film 103 made of silicon oxide is etched with hydrofluoric acid at locations where the first insulating layer 103 is facing the pinholes 132. Specifically, the pinholes 132 are formed extending through the first insulation film 103. There is, however, an extremely low probability in the formation of the pinholes 134 in the molybdenum layer as the second anti-HF layer 104 at the same locations as the pinholes 132 formed in the first anti-HF layer 102. Hydrofluoric acid, therefore, does not penetrate to the side of the thin-film device layer 121 beyond the second anti-HF layer 104. If the second anti-HF layer 104 were not formed, the hydrofluoric acid which has penetrated through the pinholes 132 would penetrate to the thin-film device layer 121 so that the hydrofluoric acid would damage the thin-film device layer 121.

Figure 3B:
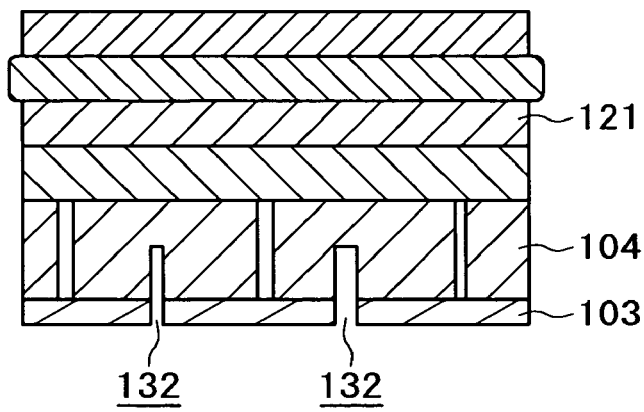

As illustrated in FIG. 3B, the molybdenum layer (thickness: 500 nm) as the first anti-HF layer 102 (see FIG. 3A) is then etched off with a mixed acid [for example, phosphoric acid ($H_3PO_4$) 72 wt %+nitric acid ($HNO_3$) 3 wt %+acetic acid ($CH_3COOH$) 10 wt %]. It takes about 1 minute to etch off the molybdenum layer of 500 nm thickness with the mixed acid. As this mixed acid does not etch the silicon oxide as the first insulating layer 103, the etching automatically stops at the first insulating layer 103. At the locations corresponding to the pinholes 132 (see FIG. 3A) formed in the first anti-HF layer 102, however, the first insulating layer 103 has been etched with the penetrated hydrofluoric acid to form pinholes, through which the mixed acid is allowed to penetrate to the second anti-HF layer 104. Accordingly, the pinholes 132 are each formed extending to an intermediate height in the second anti-HF layer 104. As the second anti-HF layer 104 is formed thicker than the first anti-HF layer 102, the etching of the second anti-HF layer 104 has, however, not been completed even after the etching of the first anti-HF layer 102 was completed. When the mixed acid etching is terminated at this stage, for example, by washing the intermediate construction with water, the mixed acid cannot penetrate to the thin-film device layer 121.

Figure 3C:
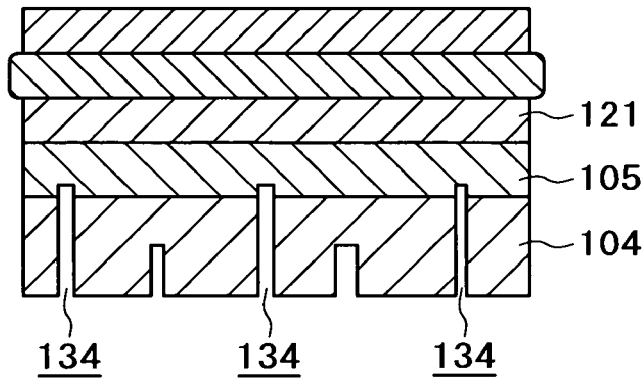

Reference is next had to FIG. 3C. With buffered hydrofluoric acid [BHF: for example, ammonium fluoride ($NH_4F$) 6%+hydrofluoric acid (HF) 1%+$H_2O$ 93%], the first insulating layer 103 (see FIG. 3B) made of silicon oxide is etched off. This buffered hydrofluoric acid requires about 1 minute to etch off the silicon oxide ($SiO_2$) when its thickness is, for example, 100 nm. As the buffered hydrofluoric acid does not etch the second anti-HF layer 104 made of molybdenum, the etching automatically stops at the second anti-HF layer 104. If the second anti-HF layer 104 contains pinholes 134, however, the buffered hydrofluoric acid still penetrates toward the thin-film device layer 121 through the pinholes 134 even after completion of the etching of the first insulating layer 103 (see FIG. 3B). As the thickness of the second insulating layer 105 is 500 nm which is greater than that of the first insulating layer 103, the buffered hydrofluoric acid, however, cannot penetrate the second insulating layer 105 beyond its intermediate height so that the buffered hydrofluoric does not reach as far as the thin-film device layer 121.

Figure 3D:
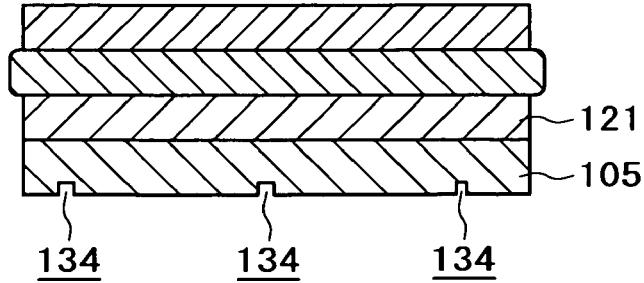

As shown in FIG. 3D, the second anti-HF layer 104 (see FIG. 3C) formed of the molybdenum layer of 1,000 nm thickness is next etched off with a similar mixed acid as that described above. This mixed acid requires about 2 minutes to etch off the molybdenum layer of 1,000 nm thickness. As this mixed acid does not etch the second insulating layer 105 made of silicon oxide ($SiO_2$), the etching with the mixed acid automatically stops at the second insulating layer 105. The mixed acid does not reach as far as the thin-film device layer 121, because the pinholes 134 formed in the second insulating layer 105 with the buffered hydrofluoric acid have not reached as far as the thin-film device layer 121.

As the second insulating layer 105 is made of silicon oxide which is an insulating material transparent to visible light, it is unnecessary to specifically remove the second insulating layer 105. Removal of the second insulating layer 105 is, therefore, not conducted in the fabrication process according to the first embodiment of the present invention.

In the above-described first embodiment, molybdenum is used as anti-HF layers for both the first and second anti-HF layers 102, 104. However, any material can be used insofar as it is equipped with resistance to HF, including tungsten, amorphous silicon, polycrystalline silicon, aluminum oxide ($Al_2O_3$), magnesium fluoride ($MgF_2$), calcium fluoride ($CaF_2$), silicon carbide (SiC), amorphous diamond, benzocyclobutene-based resins, and polyimides. When such a material is used for the first and second anti-HF layers 102, 104, it is necessary to conduct wet etching with such chemical solutions as enabling removal of the respective layers or dry etching with such etching gases as permitting removal of the respective layers. When polycrystalline silicon is used, for example, the first and second anti-HF layers 102, 104 can be removed by dry etching such as reactive ion etching (RIE) which makes use of an etching gas composed in combination of tetrafluoromethane ($CF_4$) and oxygen ($O_2$). When the first anti-HF layer 102 and second anti-HF layer 104 are etched by using the same chemical in common, the etching must be conducted such that the etching of the first anti-HF layer 102 is completed earlier. This is to avoid etching of the second anti-HF layer 104 in its entirety during etching of the first anti-HF layer 102 when a chemical solution penetrates to the second anti-HF layer 104 through the pinholes 132 in the first anti-HF layer 102 upon etching the first anti-HF layer 102 with the chemical solution.

Figure 4A:
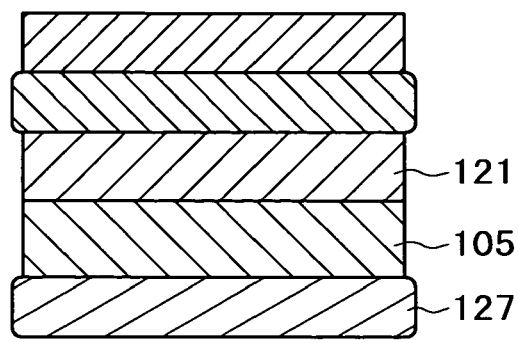
FIGS. 4A through 4C show a partial fabrication flowchart of the process according to the first embodiment of the present invention, and illustrate steps after the step depicted in FIG. 1E, that is, steps for transferring the transmission active matrix substrate onto an application substrate made of plastics to obtain an active substrate.

As illustrated in FIG. 4A, a second adhesive layer 127 is formed on the side of the back side of the thin-film device layer 121, in other words, on the surface of the second insulating layer 105 after the above-described etching by coating, for example, an UV curable adhesive, for example, by a spin coating technique.

Figure 4B:
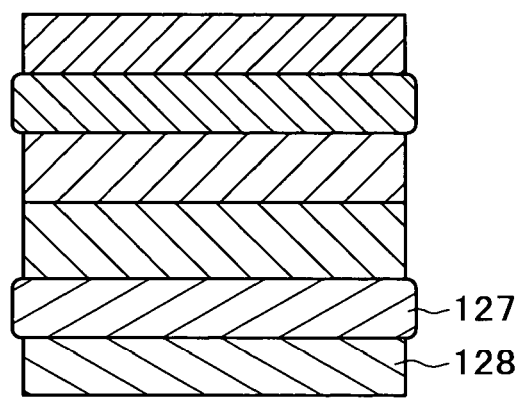

Referring next to FIG. 4B, a third substrate 128 is bonded to the second adhesive layer 127 subsequent to the formation of the second layer 127. As this third substrate 128, a plastic substrate is used. By using, for example, a polycarbonate film of 0.2 mm thickness as the plastic substrate and exposing it to ultraviolet rays, the second adhesive layer 127 made of the UV curable adhesive is cured. Although the polycarbonate substrate is used as the plastic substrate in the above-described first embodiment, the plastic substrate is not limited to such a polycarbonate substrate and instead, other plastic substrates may also be used.

Figure 4C:
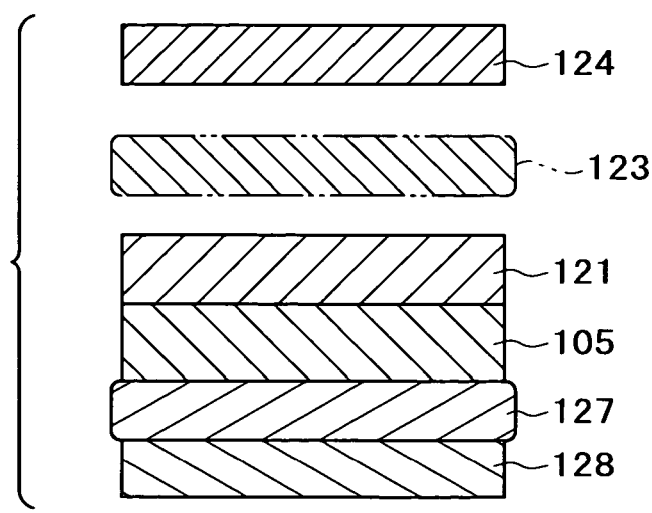

Reference is next had to FIG. 4C. The intermediate construction prepared as described above is dipped in an alcohol (not shown) to remove the second substrate 124 by dissolving the first adhesive layer 123 made of the hot melt adhesive. As a result, an active substrate is obtained with the thin-film device layer 121 mounted over the third adhesive layer 128 with the second adhesive layer 127 and second insulating layer 105 interposed therebetween.

Although not shown in any drawing, the active substrate is subsequently combined with an opposite substrate, and into openings formed between the substrates, a liquid crystal is injected to provide a liquid crystal cell. This work can be performed by conventional assembling steps for liquid crystal cells.

In the above-described fabrication process of the thin-film device, the etch rate of the first insulating layer 103 may desirably be lower than that of the first substrate 101 when the first insulating layer 103 is removed with the same chemical solution as the chemical solution (hydrofluoric acid) employed upon removal of the first substrate. When the first and second anti-HF layers 102, 104 are made of a material or materials commonly etchable with the same chemical solution (for example, the above-described mixed acid) and are etched with the same chemical solution (for example, the above-described mixed acid), it is desired that the etching of the first anti-HF layer 102 located closer to the first substrate 101 is completed earlier than that of the second anti-HF layer 104. In the above-described first embodiment, the first anti-HF layer 102 is formed thinner than the second anti-HF layer 104.

In the above-described fabrication process of the thin-film device, the protective layer 106 which serves to protect the thin-film device layer 121 from the chemical solution is formed of at least two layers having resistance to hydrofluoric acid used upon removal of the first substrate 101, specifically the first and second anti-HF layers 102, 104 made of molybdenum. Practically speaking, the protective layer is hence arranged as two or more layers. Even if hydrofluoric-acid reaches the inner protective layer (second anti-HF layer 104) through the pinholes 132 formed in the outer protective layer (first anti-HF layer 102) located closer to a side where the intermediate construction is maintained in contact with hydrofluoric acid, it is still possible to prevent at the second anti-HF layer 104 any further penetration of hydrofluoric acid to the side of the thin-film device layer 121. The pinholes 132,134 in the first and second anti-HF layers 102, 104, which have resistance to hydrofluoric acid to be employed upon removal of the first substrate 101, are very small and occur at random. Accordingly, the probability that the pinholes 132 and 134 would be formed at the same locations is extremely low. The above-described anti-penetration measure makes use of this extremely low probability. Let's assume, for example, that pinholes 132,134 are formed in the first and second anti-HF layers 102, 104 having resistance to hydrofluoric acid to be used upon removal of the first substrate 101. Even if the hydrofluoric acid penetrates through the first anti-HF layer 102, there is the second anti-HF layer 104 as the second layer. The hydrofluoric acid is, therefore, blocked there. With the first and second anti-HF layers 102, 104 having resistance to hydrofluoric acid, penetration of hydrofluoric acid to the thin-film device layer 121 can be surely prevented. Accordingly, transfer-related defects can be decreased.

With reference to FIGS. 5A through 7, a description will next be made about a process according to a second embodiment of the present invention for the fabrication of a thin-film device, specifically about steps for forming a reflection active substrate on a plastic substrate by a transfer method for the fabrication of a liquid crystal display.

Figure 5A:
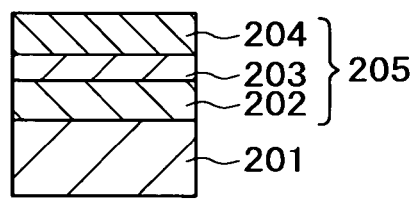
FIGS. 5A through 5E show a similar partial fabrication flowchart as in FIGS. 1A through 1E, but illustrates a process according to a second embodiment of the present invention for the fabrication of a liquid crystal display.

As illustrated in FIG. 5A, a glass substrate or silica substrate of approximately 0.4 to 1.1 mm thickness is used as a first substrate 201 which will serve as an original substrate. A first anti-HF layer 202 having resistance to hydrogen fluoride and hydrofluoric acid, a second anti-HF layer 203 having resistance to hydrogen fluoride and hydrofluoric acid, and a first insulating layer 204 are formed one by one from the lowest layer on the first substrate 201 (for example, a glass substrate of 0.7 mm thickness) to provide a protective layer 205. The first anti-HF layer 202 is arranged by forming, for example, a molybdenum (Mo) thin film to an illustrative thickness of 500 nm. The second anti-HF layer 203 is arranged by forming, for example, an amorphous silicon (a-Si) layer to an illustrative thickness of 200 nm. The first insulating layer 204 is provided by forming, for example, a silicon oxide ($SiO_2$) layer to an illustrative thickness of 500 nm. The molybdenum thin film can be formed by sputtering, while the amorphous silicon layer and silicon oxide layer can be formed by plasma CVD (chemical vapor deposition).

Figure 6:
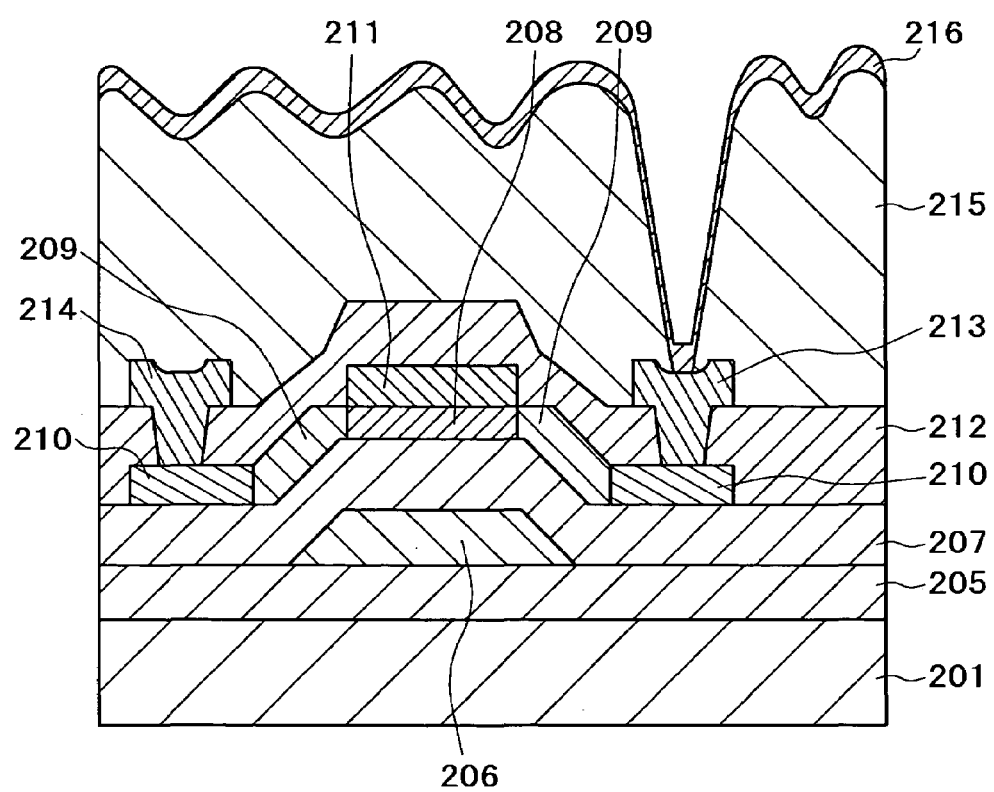
FIG. 6 is a similar fragmentary schematic cross-sectional view as in FIG. 2, but depicts a reflection active matrix substrate formed in the step illustrated in FIG. 5A.

As illustrated in FIG. 6, a thin-film transistor (TFT) is then formed by a low-temperature polysilicon bottom-gate thin-film transistor (TFT) process in a similar manner as in the first embodiment. The second embodiment is different from the first embodiment in that, because the thin-film device is the reflection active substrate useful for the fabrication of the liquid crystal display, a pixel electrode 216 uses silver (Ag) instead of ITO and this silver (Ag) is used as a reflector. The second embodiment is also different from the first embodiment in that upon formation of a planarization layer 215 with a methyl-methacrylate-based resin, the planarization layer is provided with ruggedness to also provide silver (Ag), which is to be formed over the planarization layer, with ruggedness so that regular reflection of light can be prevented.

Described specifically, a gate electrode 206 is formed on the protective layer 205, for example, with a molybdenum film the thickness of which is 100 nm, for example. This gate electrode 206 can be formed by conventional photolithography and etching techniques. By plasma CVD, for example, a gate insulation film 207 is formed with a silicon oxide ($SiO_2$) layer or with a laminate composed of a silicon oxide ($SiO_2$) layer and a silicon nitride ($SiN_x$) layer such that the gate electrode 206 is covered by the gate insulation film 207. In continuation with the gate insulation film 207, an amorphous silicon layer (thickness: 30 nm to 100 nm) is formed further. A pulsed XeCl excimer laser beam with a wavelength of 308 nm is irradiated to the amorphous silicon layer to melt and recrystallize it such that a polysilicon layer is formed as a crystalline silicon layer. Using this polysilicon layer, a polysilicon layer 208 is formed to provide a channel-forming region. Formed on each side of the polysilicon layer 208 are polysilicon layers 209 composed of an $n^-$ dope region and a polysilicon layer 210 composed of an $n^+$ dope region. As appreciated from the foregoing, each active region is formed as an LDD (lightly doped drain) structure compatible with both a high on-current and a low off-current. On the polysilicon layer 208, a stopper layer 211 is formed, for example, with a silicon oxide ($SiO_2$) layer to protect the channel upon implantation of $n^-$ phosphorus ions.

By plasma CVD, a passivation film 212 is formed further with a silicon oxide ($SiO_2$) layer or with a laminate composed of a silicon oxide ($SiO_2$) layer and a silicon nitride ($SiN_x$) layer. On the passivation film 212, a source electrode 213 and drain electrode 214 are formed, for example, with aluminum such that these electrodes are connected to the individual polysilicon layers 210.

To protect the device and also to effect planarization, a planarization layer 215 is then formed, for example, with a methyl-methacrylate-based resin, for example, by the spin coating method such that the source electrode 213, the drain electrode 214 and the like are covered by the planarization layer 215. To provide a pixel electrode, which is to be formed over the planarization layer 215, with ruggedness, the planarization layer 215 is provided at a surface thereof with ruggedness. In the planarization layer 215, a contact hole is also formed extending to the source electrode 213. By forming, for example, silver (Ag) into a film by sputtering, for example, a pixel electrode 216 is then formed on the planarization layer 215 such that the pixel electrode 215 is connected to the source electrode 213 via the contact hole.

By the above-described steps, a reflection active matrix substrate can be formed on the first substrate 201. A description will next be made about steps for transferring the thin-film device layer from the first substrate 201 onto a plastic substrate.

As described above with reference to FIG. 5A, an intermediate construction has been obtained by forming the first anti-HF layer 202, the second anti-HF layer 203, the first insulating layer 204 and a thin-film device layer 221 on the first substrate 201. Reference is now had to FIG. 5B. While heating the intermediate construction at 80° C. to 140° C. on a hot plate 222, a first adhesive layer 223 is formed by coating, for example, a hot melt adhesive to an illustrative thickness of 1 mm or so.

Figure 5D:
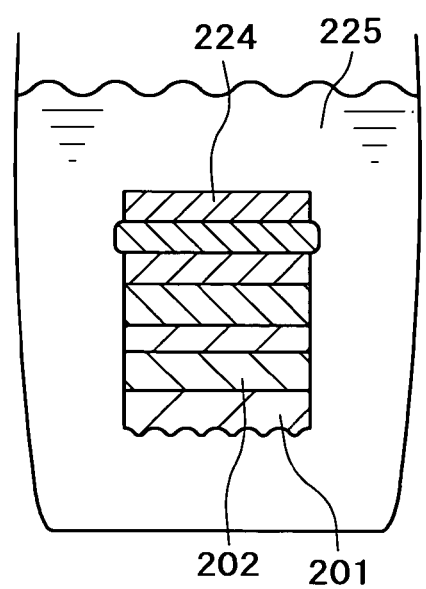
Figure 5B:
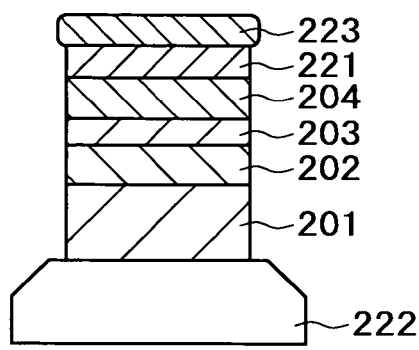
Figure 5C:
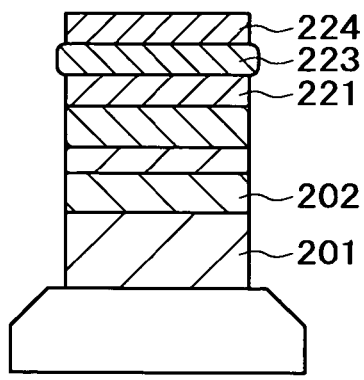

As shown in FIG. 5C, a second substrate 224 is next mounted on the first adhesive layer 223 and, while pressing the second substrate 224 toward the first substrate 201, the resulting intermediate construction is allowed to cool down to room temperature. As the second substrate 224, a molybdenum (Mo) substrate of 1 mm thickness can be used, for example. As an alternative, it is possible to coat a hot melt adhesive on the second substrate 224 and then to mount the first substrate 201, on which the layers ranging from the first anti-HF layer 202 to the thin-film device layer 221 have been formed, on the thus-coated hot melt adhesive with the thin-film device layer 221 being directed toward the second substrate 224.

Reference is next had to FIG. 5D. An intermediate construction with the second substrate 224 bonded thereto via the first adhesive layer 223 is then dipped in hydrofluoric acid 225 to perform etching of the first substrate 201. Because the molybdenum layer as the first anti-HF layer 202 is not etched with the hydrofluoric acid 225, the etching automatically stops at the first anti-HF layer 202. Illustrative of the hydrofluoric acid 225 employed here is one having a weight concentration of 50%. With such an etchant, the etching time can be set, for example, at 3.5 hours. The concentration of the hydrofluoric acid 225 and the etching time with the hydrofluoric acid 225 may be changed without any problem insofar as the glass of the first substrate 201 can be fully etched off.

Figure 5E:
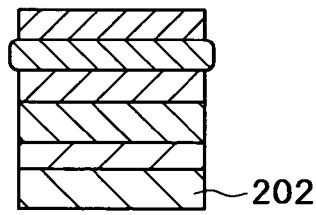

As a result of the above-described etching with the hydrofluoric acid 225, the first substrate 201 (see FIG. 5D) is fully etched off so that the first anti-HF layer 202 is exposed (see FIG. 5E).

Figure 7:
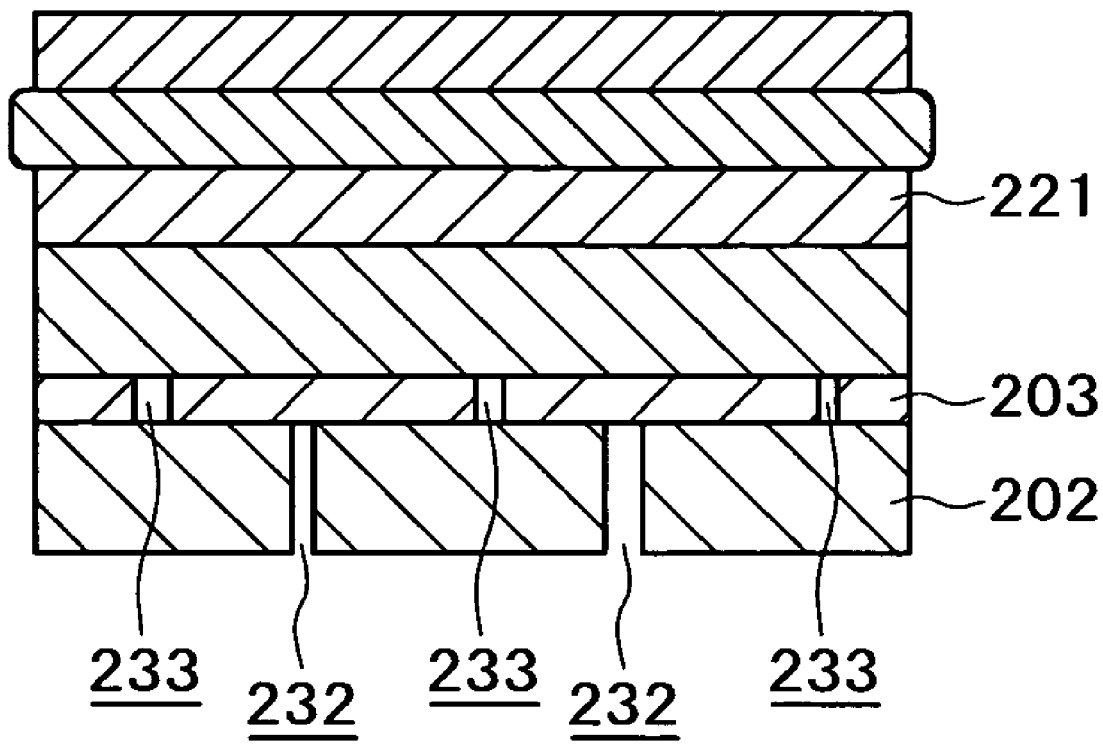
FIG. 7 is a fragmentary schematic cross-sectional view depicting a positional relationship between pinholes in one of two protective layers and those in the other protective layer in the etching step illustrated in FIG. 5D.

When pinholes 232 are contained in the molybdenum layer as the first anti-HF layer 202 as shown in FIG. 7, hydrofluoric acid tries to penetrate further to the second anti-HF layer 203 through the pinholes 232. There is, however, an extremely low probability in the formation of the pinholes 233 in the second anti-HF layer 203 at the same locations as the pinholes 332 formed in the first anti-HF layer 202. Hydrofluoric acid, therefore, does not penetrate to the side of the thin-film device layer 221 beyond the second anti-HF layer 203. If the second anti-HF layer 203 were not formed, the hydrofluoric acid which has penetrated through the pinholes 232 would penetrate to the thin-film device layer 221 so that the hydrofluoric acid would damage the thin-film device layer 221.

As the thin-film device fabricated by the process according to the second embodiment is for use in a reflection liquid crystal display, no problem arises in display performance even if three is the opaque layer underneath the thin-film device layer 221. Therefore, the active substrate is subsequently combined with an opposite substrate, and between the substrates, a liquid crystal is injected to provide a liquid crystal cell. This work can be performed by conventional assembling steps for liquid crystal cells.

In the above-described process according to the second embodiment for the fabrication of the thin-film device, the first anti-HF layer 202 and second anti-HF layer 203 may desirably be made of materials at least one of which is not etchable with any common chemical solution (the mixed acid).

In the above-described process according to the second embodiment for the fabrication of the thin-film device, the protective layer 205 which serves to protect the thin-film device layer 221 from the chemical solution is formed of at least two layers having resistance to hydrofluoric acid used upon removal of the first substrate 201, specifically the first anti-HF layer 202 made of molybdenum and the second anti-HF layer 203 made of amorphous silicon. Practically speaking, the protective layer is hence arranged as two or more layers. Even if hydrofluoric acid reaches the inner protective layer (second anti-HF layer 203) through the pinholes 232 formed in the outer protective layer (first anti-HF layer 202) located closer to a side where the intermediate construction is maintained in contact with hydrofluoric acid, it is still possible to prevent at the second anti-HF layer 203 any further penetration of hydrofluoric acid to the side of the thin-film device layer 221. The pinholes 232, 233 in the first and second anti-HF layers 202,203, which have resistance to HF to be employed upon removal of the first substrate 201, are very small and occur at random. Accordingly, the probability that the pinholes 232 and 233 would be formed at the same locations is extremely low. The above-described anti-penetration measure makes use of this extremely low probability. Let's assume, for example, that pinholes 232, 233 are formed in the first and second anti-HF layers 202,203 having resistance to hydrofluoric acid to be used upon removal of the first substrate 201. Even if the hydrofluoric acid penetrates through the first anti-HF layer 202, there is the second anti-HF layer 203 as the second layer. The hydrofluoric acid is, therefore, blocked there. With the first and second anti-HF layers 202,203 having resistance to hydrofluoric acid, penetration of hydrofluoric acid to the thin-film device layer 221 can be surely prevented. Accordingly, transfer-related defects can be decreased.

With reference to FIGS. 8A through 10B, a description will next be made about a process according to a third embodiment of the present invention for the fabrication of a thin-film device, specifically about steps for forming an active matrix substrate on a plastic substrate by a transfer method for the fabrication of an active-matrix-type organic electroluminescence (EL) display.

Figure 8A:
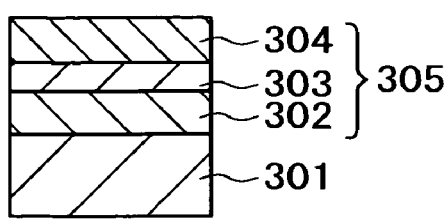
FIGS. 8A through 8E show a similar partial fabrication flowchart as in FIGS. 1A through 1E, but illustrates a process according to a third embodiment of the present invention for the fabrication of a liquid crystal display.

As illustrated in FIG. 8A, a glass substrate or silica substrate of approximately 0.4 to 1.1 mm thickness is used as a first substrate 301 which will serve as an original substrate. A first anti-HF layer 302 having resistance to hydrogen fluoride and hydrofluoric acid, a second anti-HF layer 303 having resistance to hydrogen fluoride and hydrofluoric acid, and a first insulating layer 304 are formed one by one from the lowest layer on the first substrate 301 (for example, a glass substrate of 0.7 mm thickness) to provide a protective layer 305. The first anti-HF layer 302 is arranged by forming, for example, a molybdenum (Mo) film to an illustrative thickness of 500 nm. The second anti-HF layer 303 is arranged by forming, for example, aluminum oxide ($Al_2O_3$) film to an illustrative thickness of 200 nm. The first insulating layer 304 is provided by forming, for example, a silicon oxide ($SiO_2$) layer to a thickness of 500 nm. The molybdenum film and aluminum oxide film can be formed by sputtering, while the silicon oxide layer can be formed by plasma CVD (chemical vapor deposition).

A thin-film transistor (TFT) is then formed as a thin-film device layer by a low-temperature polysilicon bottom-gate thin-film transistor (TFT) process such as that described, for example, in "'99 Latest Liquid Crystal Process Technology", 53–59, Press Journal Inc., Tokyo, 1998 or "Flat Panel Displays 1999", 132–139, Nikkei Business Publications, Inc., Tokyo, 1998.

Figure 9:
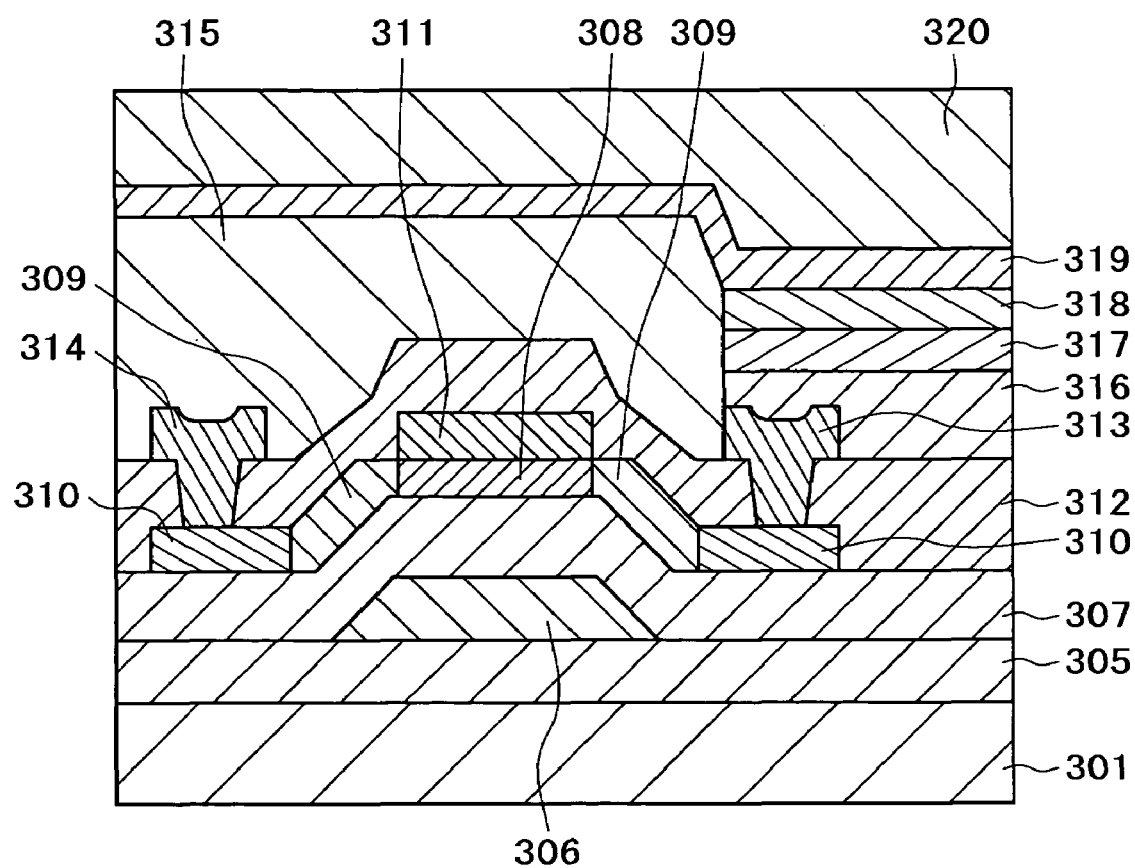
FIG. 9 is a similar fragmentary schematic cross-sectional view as in FIG. 2, but depicts a thin-film device which is formed in the step illustrated in FIG. 8A and includes from a TFT layer to an organic EL layer.

Described specifically, as shown in FIG. 9, a gate electrode 306 is formed on the protective layer 305, for example, with a molybdenum film. This gate electrode 306 can be formed by conventional photolithography and etching techniques. A gate insulation film 307 is formed, for example, with a silicon oxide ($SiO_2$) layer or with a laminate composed of a silicon oxide ($SiO_2$) layer and a silicon nitride ($SiN_x$) layer such that the gate electrode 306 is covered by the gate insulation film 307. In continuation with the gate insulation film 307, an amorphous silicon layer (thickness: 30 nm to 100 nm) is formed further. A pulsed XeCl excimer laser beam with a wavelength of 308 nm is irradiated to the amorphous silicon layer to melt and recrystallize it such that a polysilicon layer is formed as a crystalline silicon layer. Using this polysilicon layer, a polysilicon layer 308 is formed to provide a channel-forming region. Formed on each side of the polysilicon layer 308 are polysilicon layers 309 composed of an n⁻ dope region and a polysilicon layer 310 composed of an n⁺ dope region. As appreciated from the foregoing, each active region is formed as an LDD (lightly doped drain) structure compatible with both a high on-current and a low off-current. On the polysilicon layer 308, a stopper layer 311 is formed, for example, with a silicon oxide ($SiO_2$) layer to protect the channel upon implantation of n⁻ phosphorus ions.

By plasma CVD, a passivation film 312 is formed further with a silicon oxide ($SiO_2$) layer or with a laminate composed of a silicon oxide ($SiO_2$) layer and a silicon nitride ($SiN_x$) layer. On the passivation film 312, a source electrode 313 and drain electrode 314 are formed, for example, with aluminum such that these electrodes are connected to the individual polysilicon layers 310.

A protective insulation layer 315 is then formed, for example, with a methyl-methacrylate-based resin, for example, by the spin coating method such that the source electrode 313, the drain electrode 314 and the like are covered by the protective insulation layer 315. To permit connection of the source electrode 313 with an anode of an organic EL element to be formed subsequently, the protective insulation layer 315 is then removed by a conventional photolithographic technique and etching technique at a portion thereof located adjacent the source electrode 313 and the anode.

On the protective insulation layer 315, an organic EL element is then formed. The organic EL element is composed of an anode 316, an organic layer, and a cathode 319. As the anode 316, an aluminum (Al) film is formed, for example, by sputtering such that the aluminum (Al) film is connected to the source electrodes 313 of individual TFTs to permit feeding of a current independently to the source electrodes 313.

The organic layer has a structure in the form of a laminate of an organic hole transport layer 317 and an organic emitter layer 318. The organic hole transport layer 317 can be formed, for example, to a thickness of 30 nm by vapor deposition of copper phthalocyanine. As the organic emitter layer 318, Alq3 [tris(8-hydroxyquinolinolato)aluminum (III)] can be applied as a green color to a thickness of 50 nm, Bathocuproine (2,9-dimethyl-4,7-diphenyl-1,10-phenanthroline) as a blue color to a thickness of 14 nm, and BSB-BCN [2,5-bis{4-(N-methoxyphenyl)-N-phenylamino]styryl}benzene-1,4-dicarbonitrile] as a red color to a thickness of 30 nm, all by vapor deposition.

As the cathode 319, ITO can be used.

In the above-described fabrication process according to the third embodiment, the organic EL element adopted the above-described structure. As the electrodes, however, it is possible to use conventionally known structures making combined use of electron transport layers, hole transport layers, electron injection layers, hole injection layers, electron blocking layers, hole blocking layers and emitter layers.

Further, a passivation film 320 is formed to cover the cathode electrode 319. In this embodiment, a silicon nitride ($Si_3N_4$) film can be formed as the passivation film 320, for example, to a thickness of 300 nm by sputtering. As an alternative, the passivation film 320 may also be formed by CVD, vapor deposition or the like.

The construction ranging from the TFT layer to the organic EL layer will hereinafter be called "the thin-film device layer". A description will next be made about steps for transferring the thin-film device layer from the first substrate 301 onto a plastic substrate.

Figure 8B:
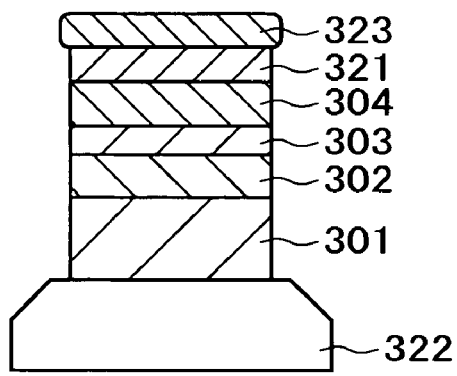

As described above with reference to FIG. 8A, an intermediate construction has been obtained by forming the first anti-HF layer 302, the second anti-HF layer 303, the first insulating layer 304 and the thin-film device layer 321 on the first substrate 301. Reference is now had to FIG. 8B. While heating the intermediate construction at 80° C. to 140° C. on a hot plate 322, a first adhesive layer 323 is formed by coating, for example, a hot melt adhesive to an illustrative thickness of 1 mm or so.

Figure 8C:
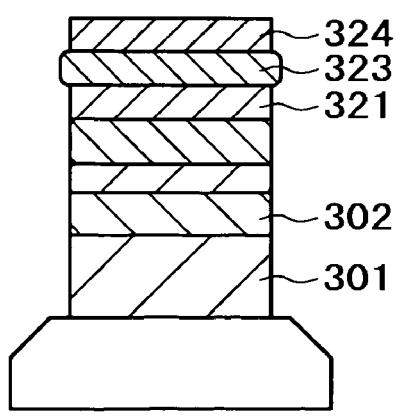

As shown in FIG. 8C, a second substrate 324 is next mounted on the first adhesive layer 323 and, while pressing the second substrate 324 toward the first substrate 301, the resulting intermediate construction is allowed to cool down to room temperature. As the second substrate 324, a molybdenum (Mo) substrate of 1 mm thickness can be used, for example. As an alternative, it is possible to coat a hot melt adhesive on the second substrate 324 and then to mount the first substrate 301, on which the layers ranging from the first anti-HF layer 302 to the thin-film device layer 321 have been formed, on the thus-coated hot melt adhesive with the thin-film device layer 321 being directed toward the second substrate 324.

Figure 8D:
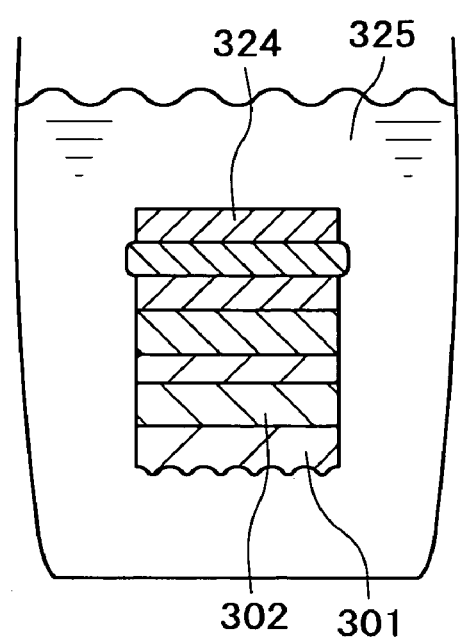

Reference is next had to FIG. 8D. An intermediate construction with the second substrate 324 bonded thereto via the first adhesive layer 323 is then dipped in hydrofluoric acid 325 to perform etching of the first substrate 301. Because the molybdenum layer as the first anti-HF layer 302 is not etched with the hydrofluoric acid 325, the etching automatically stops at the first anti-HF layer 302. Illustrative of the hydrofluoric acid 325 employed here is one having a weight concentration of 50%. With such an etchant, the etching time can be set, for example, at 3.5 hours. The concentration of the hydrofluoric acid 325 and the etching time with the hydrofluoric acid 325 may be changed without any problem insofar as the glass of the first substrate 301 can be fully etched off.

Figure 8E:
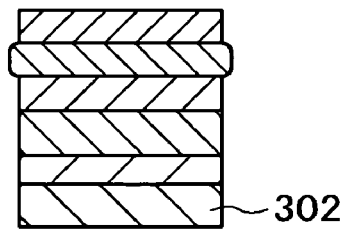

As a result of the above-described etching with the hydrofluoric acid 325, the first substrate 301 (see FIG. 8D) is fully etched off so that the first anti-HF layer 302 is exposed (see FIG. 8E).

Figure 10A:
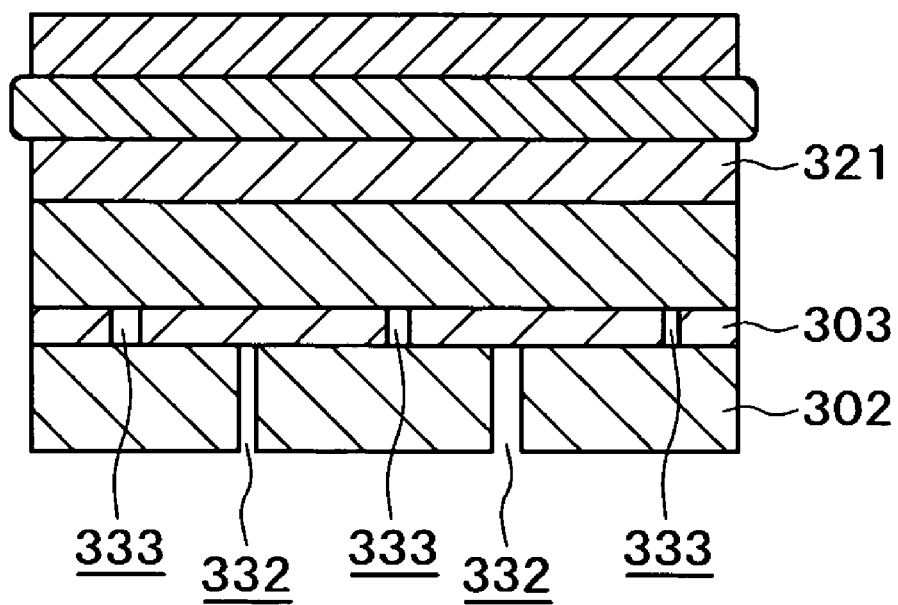
FIGS. 10A and 10B are fragmentary schematic cross-sectional views depicting penetration of a mixed acid through pinholes in two protective layers in an etching step shown in FIG. 8D.

When pinholes 332 are contained in the molybdenum layer as the first anti-HF layer 302 as shown in FIG. 10A, hydrofluoric acid tries to penetrate further to the second anti-HF layer 303 through the pinholes 332. There is, however, an extremely low probability in the formation of the pinholes 333 in the second anti-HF layer 303 at the same locations as the pinholes 232 formed in the first anti-HF layer 302. Hydrofluoric acid, therefore, does not penetrate to the side of the thin-film device layer 321 beyond the second anti-HF layer 303. If the second anti-HF layer 303 were not formed, the hydrofluoric acid which has penetrated through the pinholes 332 would penetrate to the thin-film device layer 321 so that the hydrofluoric acid would damage the thin-film device layer 321.

Figure 10B:
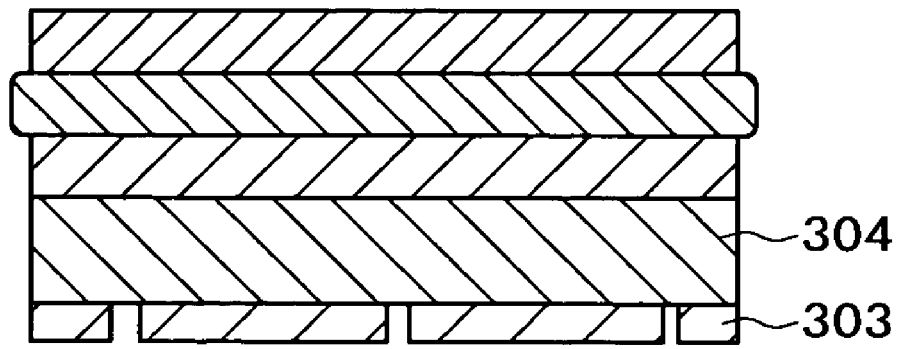

As illustrated in FIG. 10B, the molybdenum (thickness: 300 nm) as the first anti-HF layer 302 (see FIG. 10A) is then etched off with a mixed acid [for example, phosphoric acid ($H_3PO_4$) 72 wt %+nitric acid ($HNO_3$) 3 wt %+acetic acid ($CH_3COOH$) 10 wt %]. It takes about 1 minute to etch off the molybdenum layer of 500 nm thickness with the mixed acid. As this mixed acid does not etch the silicon oxide as the second anti-HF layer 303, the etching automatically stops at the second anti-HF layer 303.

In the above-described third embodiment, the first anti-HF layer 302 was removed by using a solvent (the mixed acid). It may be removed by dry etching. Molybdenum as the first anti-HF layer 302 can be removed by dry etching while using a gas composed in combination of sulfur hexafluoride ($SF_6$) and oxygen ($O_2$) (for example, by reactive ion etching). Under this condition, the aluminum oxide layer as the second anti-HF layer 303 is not etched, so that the etching automatically stops at the second anti-HF layer 303.

Further, the second anti-HF layer 303 and the first insulating layer 304 are both transparent to visible light and are both insulating layers. Their removal is not needed, accordingly. In the above-described third embodiment, the second anti-HF layer 303 and the first insulating layer 304 were not removed.

Compared with the second embodiment, the third embodiment has a merit that owing to the formation of the second anti-HF layer 303 with the transparent material, its etching can be obviated to result in the fewer etching steps.

The first anti-HF layer 302 was formed with molybdenum, but it can be formed with any appropriate material other than the material of the second anti-HF layer 303. Usable examples include tungsten, amorphous silicon, polycrystalline silicon, aluminum oxide, magnesium fluoride ($MgF_2$), calcium fluoride ($CaF_2$) silicon carbide (SiC), amorphous diamond, benzocyclobutene-based resins, polyimides and the like. For the second anti-HF layer 303, on the other hand, aluminum oxide was used. It is, however, possible to use a transparent material such as magnesium fluoride ($MgF_2$), calcium fluoride ($CaF_2$) or a transparent polyimide. There is, however, one condition in this respect, that is, the first anti-HF layer 302 and the second anti-HF layer 303 are not etched by the same chemical solution.

The subsequent steps ranging from the combination with a plastic substrate to the removal of the hot melt adhesive, can be conducted in a similar manner as in the above-described, first embodiment or second embodiment. Subsequent to the formation of the thin-film device layer on the plastic substrate through the above-described steps, conventional fabrication steps for organic EL elements can be conducted to provide a display.

In the above-described process according to the third embodiment for the fabrication of the thin-film device, the protective layer 305 which serves to protect the thin-film device layer 321 from the chemical solution is formed of at least two layers having resistance to hydrofluoric acid used upon removal of the first substrate 301, specifically the first anti-HF layer 302 made of molybdenum and the second anti-HF layer 303 made of aluminum oxide. Practically speaking, the protective layer is hence arranged as two or more layers. Even if hydrofluoric acid reaches the inner protective layer (second anti-HF layer 303) through the pinholes 332 formed in the outer protective layer (first anti-HF layer 302) located closer to a side where the intermediate construction is maintained in contact with hydrofluoric acid, it is still possible to prevent at the second anti-HF layer 303 any further penetration of hydrofluoric acid to the side of the thin-film device layer 321. The pinholes 332,333 in the first and second anti-HF layers 302,303, which have resistance to hydrofluoric acid to be employed upon removal of the first substrate 301, are very small and occur at random. Accordingly, the probability that the pinholes 332 and 333 would be formed at the same locations is extremely low. The above-described anti-penetration measure makes use of this extremely low probability. Let's assume, for example, that pinholes 332,333 are formed in the first and second anti-HF layers 302,303 having resistance to hydrofluoric acid to be used upon removal of the first substrate 301. Even if the hydrofluoric acid penetrates through the first anti-HF layer 302, there is the second anti-HF layer 303 as the second layer. The hydrofluoric acid is, therefore, blocked there. With the first and second anti-HF layers 302,303 having resistance to hydrofluoric acid, penetration of hydrofluoric acid to the thin-film device layer 321 can be surely prevented. Accordingly, transfer-related defects can be decreased.

With reference to the fabrication flowchart shown in FIGS. 11A through 11E, a description will next be made about a process according to a fourth embodiment of the present invention for the fabrication of a thin-film device, specifically about steps for forming a transmission active substrate on a plastic substrate by a transfer method for the fabrication of a liquid crystal display.

Figure 11A:
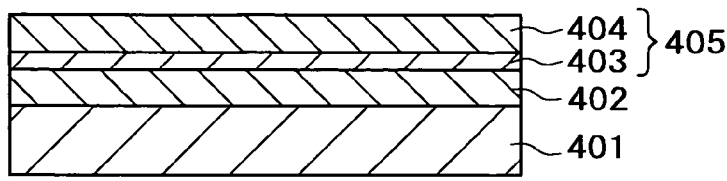
FIGS. 11A through 11E show a partial fabrication flowchart of a process according to a fourth embodiment of the present invention for the fabrication of a liquid crystal display.

As illustrated in FIG. 11A, a glass substrate or silica substrate of approximately 0.4 to 1.1 mm thickness is used as a first substrate 401 which will serve as an original substrate. By sputtering, for example, an isolation layer 402 is then formed on the first substrate 401 (for example, a glass substrate of 0.7 mm thickness). This isolation layer 402 can be formed by depositing, for example, a molybdenum (Mo) film to a thickness of 1,000 nm. A first anti-$HNO_3$ layer 403 and a second anti-$HNO_3$ layer 404 are then formed one by one from the lower layer on the isolation layer 402. The first and second anti-$HNO_3$ layers 403,403 have resistance to nitric, acid will serve as a protective layer 405 upon removal of the isolation layer 402 with nitric acid. The first anti-$HNO_3$ layer 403 is arranged, for example, by forming an aluminum oxide ($Al_2O_3$) film to an illustrative thickness of 200 nm. The second anti-$HNO_3$ layer 404 is provided by forming, for example, a silicon oxide ($SiO_2$) film to an illustrative thickness of 500 nm. The molybdenum film and the aluminum oxide film can be formed by sputtering, while the silicon oxide layer can be formed by plasma CVD (chemical vapor deposition).

Figure 11B:
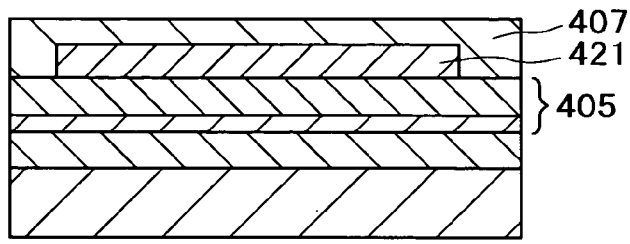

As illustrated in FIG. 11B, a thin-film device layer 421 with a thin-film transistor (TFT) included therein is then formed on the protective layer 405 by a low-temperature polysilicon bottom-gate thin-film transistor (TFT) process in a similar manner as in the first embodiment. The fourth embodiment is different from the first embodiment in that the thin-film device layer 421 does not extend to the end faces of the substrate and the end faces of the thin-film device layer 421 are covered by an upper protective layer 407 made of a methyl-methacrylate-based resin.

Figure 11C:
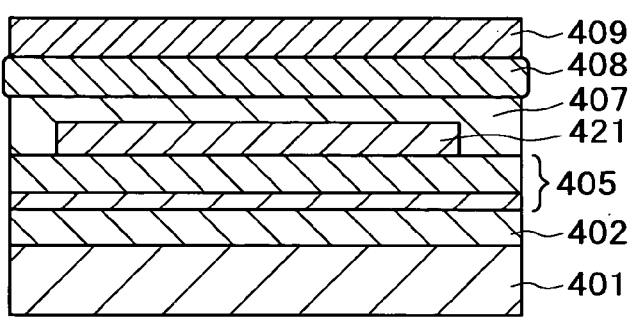

Reference is now had to FIG. 11A. In a similar manner as in the first embodiment, an intermediate construction has been obtained by forming the isolation layer 402, the protective layer 405, the thin-film device layer 421 and the upper protective layer 407 on the first substrate 401. While heating the intermediate construction at 80° C. to 140° C. on a hot plate (not shown) a first adhesive layer 408 is formed by coating, for example, a hot melt adhesive to an illustrative thickness of 1 mm or so. As illustrated in FIG. 11C, a second substrate 409 is next mounted on the first adhesive layer 408 and, while pressing the second substrate 409 toward the first substrate 401, the resulting intermediate construction is allowed to cool down to room temperature. As the second substrate 409, a molybdenum (Mo) substrate of 1 mm thickness can be used, for example. As an alternative, it is possible to coat a hot melt adhesive on the second substrate 409 and then to mount the first substrate 401, on which the layers ranging from the isolation 402 to the upper protective layer 407 have been formed, on the thus-coated hot melt adhesive with the upper protective layer 407 being directed toward the second substrate 409.

Figure 11D:
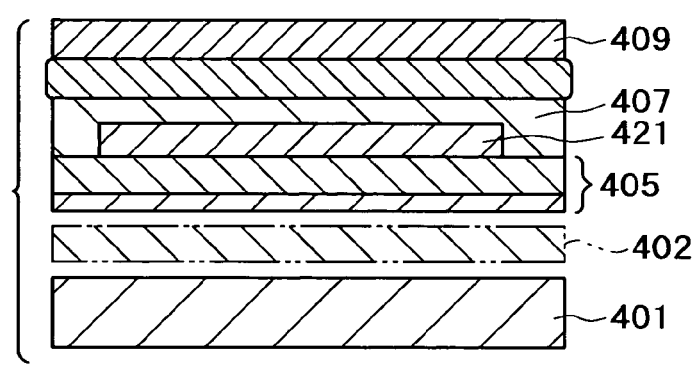

Reference is next had to FIG. 11D. An intermediate construction with the second substrate 409 bonded thereto via the first adhesive layer 408 is then dipped in nitric acid to perform etching of the molybdenum of the isolation layer 402. In this etching, neither the protective layer 405 nor the upper protective layer 407 is etched. The isolation layer 402 is soaked through the end faces thereof with nitric acid to remove only the isolation layer 402. As a result, the first substrate 401 and the remaining layers on the side of the thin-film device layer 421 are separated from each other.

Figure 11E:
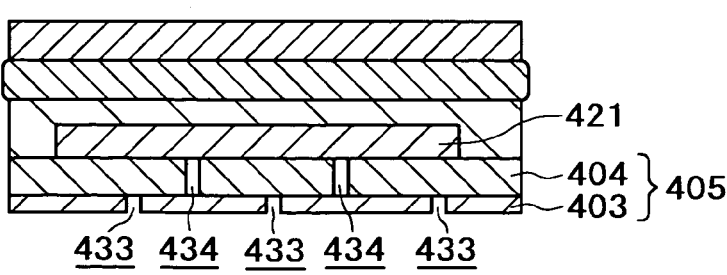

When pinholes 433 are contained in the aluminum oxide layer as the first anti-$HNO_3$ layer 403 in the protective layer 405 as shown in FIG. 11E, nitric acid penetrates through the pinholes 433 to the second anti-$HNO_3$ layer 404 made of silicon oxide. There is, however, an extremely low probability in the formation of pinholes 434 in silicon oxide film as the second anti-$HNO_3$ layer 404 at the same locations as the pinholes 433 formed in the first anti-$HNO_3$ layer 403. Nitric acid, therefore, does not penetrate to the side of the thin-film device layer 421 beyond the second anti-$HNO_3$ layer 404. If the second $HNO_3$ layer 404 were not formed, the nitric acid which has penetrated through the pinholes 433 would penetrate to the thin-film device layer 421 so that the nitric acid would damage the thin-film device layer 421.

Further, the first anti-HNO$_3$ layer 403 and the second anti-HNO$_3$ layer 404 are both transparent to visible light and are both insulating layers. Their removal is not needed, accordingly. In the above-described fourth embodiment, the anti-HNO$_3$ layer 403 and the second anti-HNO$_3$ layer 404 were not removed. In this manner, an active substrate is formed.

The subsequent steps are similar to the corresponding steps in the above-described first embodiment. Namely, the active substrate is combined with an opposite substrate, and between the active substrate and the opposite substrate, a liquid crystal is injected to provide a liquid crystal cell. This work can be performed by conventional assembling steps for liquid crystal cells.

In the above-described process according to the fourth embodiment for the fabrication of the thin-film device, the protective layer 405 which serves to protect the thin-film device layer 421 from the chemical solution is formed of at least two layers having resistance to nitric acid used upon separation of the first substrate 401, specifically the first anti-HNO$_3$ layer 403 made of aluminum oxide and the second anti-HNO$_3$ layer 404 made of silicon oxide. Practically speaking, the protective layer is hence arranged as two or more layers. Even if nitric acid reaches the inner protective layer (second anti-HNO$_3$ layer 404) through the pinholes 433 formed in the outer protective layer (first anti-HNO$_3$ layer 403) located closer to a side where the intermediate construction is maintained in contact with nitric acid, it is still possible to prevent at the anti-HNO$_3$ layer 404 any further penetration of nitric acid to the side of the thin-film device layer 421. The pinholes 433,434 in the first and second anti-HNO$_3$ layers 403,404, which have resistance to nitric acid to be employed upon separation of the first substrate 401, are very small and occur at random. Accordingly, the probability that the pinholes 433 and 434 would be formed at the same locations is extremely low. The above-described anti-penetration measure makes use of this extremely low probability. Let's assume, for example, that the pinholes 433,434 are formed in the first and second anti-HNO$_3$ layers 403,404 having resistance to nitric acid to be used upon separation of the first substrate 401. Even if the nitric penetrates through the first anti-HNO$_3$ layer 403, there is the second anti-HNO$_3$ layer 404 as the second layer. The nitric acid is, therefore, blocked there. With the first and second anti-HNO$_3$ layers 403,404 having resistance to nitric acid, penetration of nitric acid to the thin-film device layer 421 can be surely prevented. Accordingly, transfer-related defects can be decreased.

Using FIGS. 5A to 5E which illustrate the fabrication process according to the second embodiment, a description will next be made about a process according to a fifth embodiment of the present invention for the fabrication of a thin-film device. In the fifth embodiment, a reflection active substrate is formed on a plastic substrate by a transfer method for the fabrication-of a liquid crystal display. Up to the etching of a first substrate, the fifth embodiment is similar to the second embodiment.

As the fifth embodiment is directed to the reflection liquid crystal display, no problem arises even if there is an opaque layer (a first anti-HF layer 202) underneath a thin-film device layer 221 as illustrated in FIG. 5B. Removal of a molybdenum film (the first anti-HF layer 202), which is included in a protective layer 205, makes it possible to avoid the problem that an interconnection in the thin-film device layer 221 and the molybdenum in the protective layer 205 may be short-circuited, and hence, has possibility of achieving an improvement in production yield. In this fifth embodiment, the protective layer 205 is removed.

Firstly, the molybdenum film (thickness: 500 nm) as the first anti-HF layer 202 is etched off with a mixed acid [phosphoric acid (H$_3$PO$_4$) 72 wt %+nitric acid (HNO$_3$) 3 wt %+acetic acid (CH$_3$COOH). 10 wt %]. It takes about 1 minute to etch off the molybdenum layer of 500 nm thickness with the mixed acid. As this mixed acid does not etch an amorphous silicon (a-Si) layer as a second anti-HF layer 203, the etching automatically stops at the first insulating layer 103. Even if pinholes are contained in the second anti-HF layer 203, the mixed acid automatically stops at a first insulating layer 204 because it does not etch silicon oxide (SiO$_2$) as the first insulating layer 204.

The amorphous silicon (a-Si) layer (thickness: 100 nm) as the second anti-HF layer 203 is etched off with a potassium hydroxide (KOH) solution (concentration: 30%, for example). It requires about 1 minute and 30 seconds to etch off the amorphous silicon layer of 100 nm thickness. Because this potassium hydroxide (KOH) solution does not etch silicon oxide (SiO$_2$) as the first insulating layer 204, the etching automatically stops at the first insulating layer 204. As the first insulating layer 204 is made of the insulating material, it is unnecessary to specifically separate the first insulating layer 204. Separation of the first insulating layer 204 is, therefore, not conducted in the fabrication process according to the fifth embodiment of the present invention.

In the above-described fifth embodiment, the first anti-HF layer 202 and the second anti-HF layer 203 are not etched by the same chemical in common so that the insertion of an insulating layer as an etching stopper between the first anti-HF layer 202 and the second anti-HF layer 203 can be obviated. Compared with the first embodiment, the second embodiment has a merit in that it requires a fewer number of film-forming steps and a fewer number of etching steps.

In this fifth embodiment, molybdenum and amorphous silicon are used for the first anti-HF layer 202 and the second anti-HF layer 203, respectively. However, any material can be used insofar as it is equipped with resistance to HF, including tungsten, polycrystalline silicon, aluminum oxide (Al$_2$O$_3$), magnesium fluoride (MgF$_2$) calcium fluoride (CaF$_2$), silicon carbide (SiC), amorphous diamond, benzocyclobutene-based resins, and polyimides. There is, however, one condition in this respect, that is, the second anti-HF layer 203 is not etched by the chemical which is employed upon removal of the first anti-HF layer.

The subsequent steps can each be conducted in a similar manner as in Example 1.

The above-described fifth embodiment can bring about similar effects and advantages as the second embodiment, and in addition, can avoid the problem that the molybdenum in the protective layer 205 may be short-circuited.

In each of the thin-film devices obtained by the fabrication processes according to the first to fifth embodiments of the present invention, respectively, the protective layer employed in the fabrication steps is composed of at least two layers having resistance to a chemical solution used upon removal of the first substrate, specifically the first anti-HF layer and second anti-HF layer or the first anti-HNO$_3$ layer and second anti-HNO$_3$ layer. Since the thin-film devices can enjoy similar effects and advantages as their fabrication processes, the thin-film devices can be fabricated with high production yield while maintaining their thin-film device layers free from the attack by a chemical solution used upon removal of their substrates, for example, hydrofluoric acid or nitric acid. Accordingly, the use of such thin-film devices makes it possible to provide liquid crystal displays or organic EL displays of excellent quality.

While a preferred embodiment of the present invention has been described using specific terms, such description is for illustrative purpose only, and it is to be understood that changes and variations may be made without departing from the spirit or scope of the following claims.

What is claimed is:

1. A process for the fabrication of a thin-film device, said process comprising the following steps:
    forming a protective layer and a thin-film device layer one by one on a first substrate, and bonding a second substrate on said thin-film device layer via at least a first adhesive layer,
    removing said first substrate at least in a part thereof by etching with a chemical solution,
    bonding said protective layer, which covers said thin-film device layer on a side of said first substrate, to a third substrate via a second adhesive layer, and
    removing said second substrate,
    wherein said protective layer is formed of at least two layers having resistance to said chemical solution used upon removal of said first substrate.

2. The process for the fabrication of a thin-film device as claimed in claim 1, further comprising the following additional step after said removal of said first substrate:
    removing at least a part of said protective layer by etching,
    wherein said bonding step to said third substrate comprises bonding said thin-film device layer on the side of said first substrate to said third substrate via said second adhesive layer.

3. The process for the fabrication of a thin-film device as claimed in claim 1, wherein said protective layer comprises a layer, which has no resistance to said chemical solution used upon removal of said first substrate, between at least said two layers having resistance to said chemical solution.

4. The process for the fabrication of a thin-film device as claimed in claim 1, wherein, when a layer formed as at least a portion of said protective layer and having no resistance to said chemical solution used upon removal of said first substrate is removed with a chemical solution of the same kind as said chemical solution used upon removal of said first substrate, an etch rate of said layer formed as at least said portion of said protective layer and having no resistance to said chemical solution used upon removal of said first substrate is lower than an etch rate of said first substrate.

5. The process for the fabrication of a thin-film device as claimed in claim 1, wherein said at least two layers in said protective layer, said at least two layers having resistance to said chemical solution used upon removal of said first substrate, are made of materials etchable with a common chemical solution and, when etched with said common chemical solution, said etching of one of said at least two layers in said protective layer, said one layer being closer to said first substrate, is completed earlier than that of the other layer.

6. The process for the fabrication of a thin-film device as claimed in claim 1, wherein at least one of said at least two layers in said protective layer, said at least two layers having resistance to said chemical solution used upon removal of said first substrate, is not etchable with a common chemical solution.

7. The process for the fabrication of a thin-film device as claimed in claim 1, wherein one of said at least two layers in said protective layer, said at least two layers having resistance to said chemical solution used upon removal of said first substrate and said one layer being closest to said thin-film device layer, consists of a layer transparent to visible light.

8. The process for the fabrication of a thin-film device as claimed in claim 1, wherein said first substrate consists of a glass substrate, and said chemical solution used upon removal of said first substrate is a chemical solution with hydrofluoric acid contained therein.

9. The process for the fabrication of a thin-film device as claimed in claim 1, wherein said first substrate consists of a silica substrate, and said chemical solution used upon removal of said first substrate is a chemical solution with hydrofluoric acid contained therein.

10. The process for the fabrication of a thin-film device as claimed in claim 1, wherein said second substrate is bonded on said thin-film device layer via a coating layer and said first adhesive layer.

11. A process for the fabrication of a thin-film device, said process comprising the following steps:
    forming a protective layer and a thin-film device layer one by one on a first substrate, and bonding a second substrate on said thin-film device layer via at least a first adhesive layer,
    separating said first substrate at least in a part thereof by etching with a chemical solution,
    bonding said protective layer, which covers said thin-film device layer on a side of said first substrate, to a third substrate via a second adhesive layer, and
    separating said second substrate,
    wherein said protective layer is formed of at least two layers having resistance to said chemical solution used upon separation of said first substrate.

12. The process for the fabrication of a thin-film device as claimed in claim 11, further comprising the following additional step after said separation of said first substrate:
    separating at least a part of said protective layer by etching,
    wherein said bonding step to said third substrate comprises bonding said thin-film device layer on the side of said first substrate to said third substrate via said second adhesive layer.

13. The process for the fabrication of a thin-film device as claimed in claim 11, wherein said protective layer comprises a layer, which has no resistance to said chemical solution used upon separation of said first substrate, between at least said two layers having resistance to said chemical solution.

14. The process for the fabrication of a thin-film device as claimed in claim 11, wherein, when a layer formed as at least a portion of said protective layer and having no resistance to said chemical solution used upon separation of said first substrate is separated with a chemical solution of the same kind as said chemical solution used upon separation of said first substrate, an etch rate of said layer formed as at least said portion of said protective layer and having no resistance to said chemical solution used upon separation of said first substrate is lower than an etch rate of said first substrate.

15. The process for the fabrication of a thin-film device as claimed in claim 11, wherein said at least two layers in said protective layer, said at least two layers having resistance to said chemical solution used upon separation of said first substrate, are made of materials etchable with a common chemical solution and, when etched with said common chemical solution, said etching of one of said at least two layers in said protective layer, said one layer being closer to said first substrate, is completed earlier than that of the other layer.

16. The process for the fabrication of a thin-film device as claimed in claim 11, wherein at least one of said at least two layers in said protective layer, said at least two layers having resistance to said chemical solution used upon separation of said first substrate, is not etchable with a common chemical solution.

17. The process for the fabrication of a thin-film device as claimed in claim 11, wherein one of said at least two layers in said protective layer, said at least two layers having resistance to said chemical solution used upon separation of said first substrate and said one layer being closest to said thin-film device layer, consists of a layer transparent to visible light.

18. The process for the fabrication of a thin-film device as claimed in claim 11, wherein said first substrate consists of a glass substrate, and said chemical solution used upon separation of said first substrate is a chemical solution with hydrofluoric acid contained therein.

19. The process for the fabrication of a thin-film device as claimed in claim 11, wherein said first substrate consists of a silica substrate, and said chemical solution used upon separation of said first substrate is a chemical solution with hydrofluoric acid contained therein.

20. The process for the fabrication of a thin-film device as claimed in claim 11, wherein said second substrate is bonded on said thin-film device layer via a coating layer and said first adhesive layer.

* * * * *